PATENT

US008287303B2

(12) United States Patent
Chuo et al.

(10) Patent No.: US 8,287,303 B2
(45) Date of Patent: Oct. 16, 2012

(54) FLAT SIGNAL TRANSMISSION CABLE WITH BUNDLING STRUCTURE (75) Inventors: Chih-Heng Chuo, Zhongli (TW); Gwun-Jin Lin, Taoyuan (TW); Kuo-Fu Su, Zhongli (TW)

(73) Assignee: Advanced Flexible Circuits Co., Ltd., Taoyuan County (TW)

( * ) Notice: Subject to any disclaimer, the term of this patent is extended or adjusted under 35 U.S.C. 154(b) by 343 days.

(21) Appl. No.: 12/461,392

(22) Filed: Aug. 11, 2009

(65) Prior Publication Data

US 2010/0273348 A1  Oct. 28, 2010

(30) Foreign Application Priority Data

Apr. 28, 2009 (TW) .............................. 98113976 A (51) Int. Cl.
*H01R 12/24* (2006.01)
(52) U.S. Cl. ........................................ 439/492; 174/254
(58) Field of Classification Search .................. 439/492, 439/67; 174/254; 361/749
See application file for complete search history.

(56) References Cited

U.S. PATENT DOCUMENTS

| 4,493,952 | A | * | 1/1985 | Kaleida | 200/5 A |
| 5,322,974 | A | * | 6/1994 | Walston | 174/250 |
| 2006/0042820 | A1 | * | 3/2006 | Lin et al. | 174/117 F |
| 2010/0016039 | A1 | * | 1/2010 | Tokuyama | 455/575.3 |
| 2010/0271789 | A1 | * | 10/2010 | Dubois | 361/749 |
| 2010/0294556 | A1 | * | 11/2010 | Chuo et al. | 174/268 |

FOREIGN PATENT DOCUMENTS

WO  WO 2008013070 A1 *  1/2008

\* cited by examiner

*Primary Examiner* — Tulsidas C Patel
*Assistant Examiner* — Travis Chambers
(74) *Attorney, Agent, or Firm* — Rosenberg, Klein & Lee

(57) ABSTRACT

Disclosed is a flat signal transmission cable with bundling structure, including at least one flexible circuit. The flexible circuit includes a plurality of clustered flat cable components that are formed by slitting in a direction parallel to extension direction of the flexible circuit to impose free and independent flexibility for bending to each clustered flat cable component. At least one bundling structure is formed on a lateral side edge of a predetermined clustered flat cable component of the cluster section of the flexible circuit. The bundling structure forms a fastening section. When the clustered flat cable components of the cluster section of the flexible circuit are stacked to form a bundled structure, the bundling structure bundles the plurality of clustered flat cable components and is secured by being fastened by the fastening section.

12 Claims, 9 Drawing Sheets

FLAT SIGNAL TRANSMISSION CABLE WITH BUNDLING STRUCTURE

FIELD OF THE INVENTION

The present invention relates to a flexible circuit flat cable, and in particular to a flat signal transmission cable with bundling structure.

BACKGROUND OF THE INVENTION

Among the state-of-the-art printed circuit board techniques, a flexible circuit board is the most promising one, which features light weight, small volume, dynamic flexibility, and resilient deformability and offers an important advantage of three-dimensional lay out in accordance with the volume and shape of the space for lay out. The flexible circuit board is of wide applications in consumer electronic products, such as digital cameras, mobile phones, and notebook computers, and has an un-neglected contribution to compactness and sophistication of the modern micro-electronic products in which the flexible printed circuit board plays an important role for transmission.

Recently, the flexible circuit board techniques have been applied to flat cables. A conventional flat cable comprises a plurality of conductors covered with insulation arranged to joint each other in a side-by-side fashion for forming a flat cable, which is commonly used for transmission of signal in a variety of electronic and communication equipments. The flexible circuit flat cables that are commonly used currently, according to the number of conductors needed in carrying out transmission, are constructed as different flexible circuit flat cables that are either a single-sided board, a double-sided board, or a multiple-layered board.

The conventional flat cables are only suitable for extending through an elongate space. However, the current electronic or communication devices often need to arrange a flexible circuit flat cable within a bore defined in a rotational axle. For example, in a commonly seen design of mobile phones or digital cameras, a cover or a screen is connected to a body of the phone or camera with a rotational axle. To allow signals to be transmitted from the body of the phone or the camera to the cover or the screen, the state-of-the-art techniques use small gauge wires or bundled extra thin leads to serve as a signal transmission line.

SUMMARY OF THE INVENTION

In the fields of mobile phones, digital cameras, and notebook computers, it gets more common to use a flexible circuit flat cable set inside a rotational axle for signal transmission and at the same time, the rotational axle is evolved from a one-axis structure to a two-axis structure. For example, digital cameras or tablet computers use rotational axles that are of various structures. This makes it impossible for the conventional flexible circuit flat cable to meet the current trend.

The capability that a flexible circuit flat cable sustains repeated flexing or the count that a flexible circuit flat cable may be repeatedly bent is an important factor. For a flat cable adopting the conventional design, even through the cable itself is flexible enough to extend through a bore defined in a rotational axle, the conventional flat cable may cause undesired interference with the operation of the rotational axle when a product including the rotational axle is subjected to an operation of rotation by a user and a bent site of the flat cable may induce stress concentration due to bending and rotation thereof and may even get damaged due to abrasion with the rotational axle. The conventional flat cable is commonly bundled with a piece of adhesive tape or the likes to prevent the cable from getting loosened in order to facilitate the assembling of the product. However, the conventional flat cable may suffers excessive displacement due to rotation, making the flat cable abrading itself, eventually leading to entangling, twisting, and even damage of some conductors of the flat cable.

Thus, an objective of the present invention is to provide a flat signal transmission cable with bundling structure, which overcomes the drawbacks of the conventional flat signal transmission cables occurring in the applications thereof.

The solution adopted in the present invention to overcome the problems of the conventional techniques comprises a flat signal transmission cable with bundling structure, which comprises at least one flexible circuit. The flexible circuit comprises a cluster structure composed of a plurality of clustered flat cable components that is formed by slitting in a direction parallel to extension direction of the flexible circuit to impose free and independent flexibility for bending to each clustered flat cable component. At least one bundling structure is formed on a lateral side edge of a predetermined clustered flat cable component of the cluster section of the flexible circuit. The bundling structure forms a fastening section. When the clustered flat cable components of the cluster section of the flexible circuit are stacked to form a bundled structure, the bundling structure bundles the plurality of clustered flat cable components and is secured by being fastened by the fastening section.

With the solution provided by the present invention, the flat signal transmission cable of the present invention can be used in various electronic devices that have a one-axis rotational axle or a two-axis rotational axle. The clustered flat cable components of the cluster section of the flexible circuit flat cable are each allowed for independent free flexing. When the clustered flat cable components that are bundled together with the bundling structure are placed in a predetermined space for free movement, it is the bundling structure that sustains the abrasion, compression, or impact from the rotational axle. The abrasion, compression, or impact to the flat cable that occurs in the application of the conventional flat cables in electronic devices having a rotational axle can be effectively alleviated.

Further, the bundling structure may be arranged to have various configuration and sizes for bundling purposes in order to allow the clustered flat cable components to freely move inside the bundling structure. Or alternatively, it can be designed to carry out direct bundling for forming a bundle to be fit for various rotation operations.

Further, the bundling structure of the present invention can be made by being directly formed in a manufacturing process of an existing flexible printed circuit board and the known problems can be effectively alleviated without additionally increasing extra cost of manufacturing.

BRIEF DESCRIPTION OF THE DRAWINGS

The present invention will be apparent to those skilled in the art by reading the following description of preferred embodiments of the present invention, with reference to the attached drawings, in which.

DETAILED DESCRIPTION OF THE PREFERRED EMBODIMENTS

Figure 1:
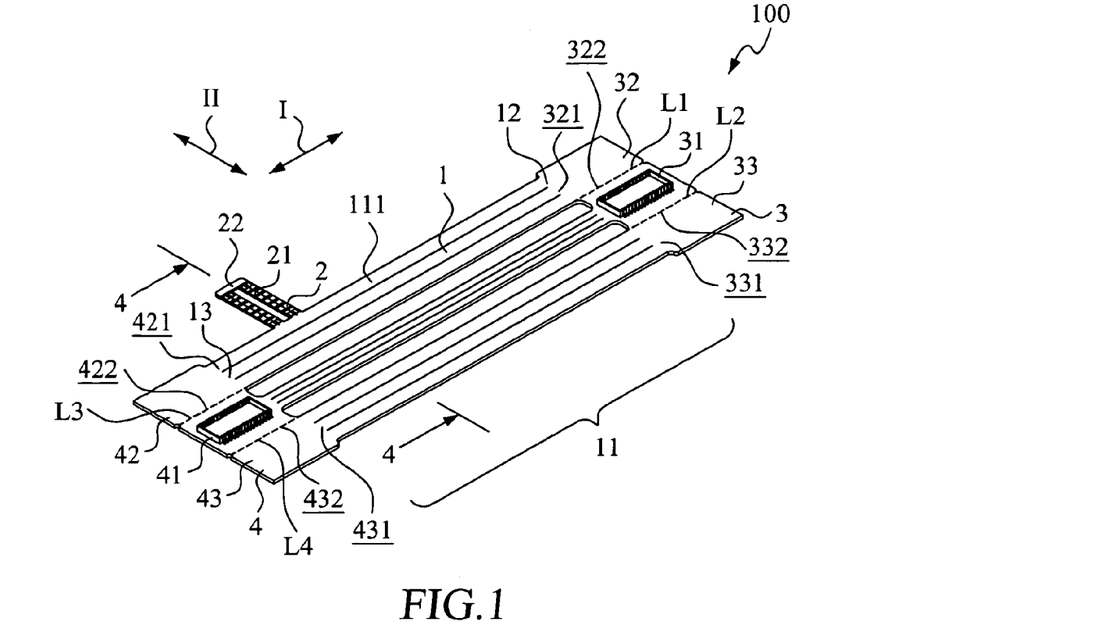
FIG. 1 is a perspective view showing a first embodiment of the present invention.

With reference to the drawings and in particular to FIG. 1, which is a perspective view showing a flat signal transmission cable with bundling structure in accordance with a first embodiment of the present invention, the flat signal transmission cable constructed in accordance with the present invention, generally designated at 100, comprises at least one flexible circuit 1, a bundling structure 2, a first connection section 3, and a second connection section 4. The flexible circuit 1 comprises a cluster section 11, which comprises a cluster structure composed of a plurality of clustered flat cable components that is formed by slitting in a direction parallel to extension direction I of the flexible circuit 1 to impose free and independent flexibility for bending to each clustered flat cable component. In the instant embodiment, the bundling structure 2 is formed on a lateral side edge of an outermost clustered flat cable component 111 of the cluster section 11 of the flexible circuit 1 and projects outward in a direction II substantially perpendicular to the outermost clustered flat cable component 111. Further, the bundling structure 2 forms at least one hollow zone 21 and a fastening section 22.

The first connection section 3 is set at a first end 12 of the flexible circuit 1. The first connection section 3 comprises a first connector 31, a first folding section 32, and a second folding section 33. The first folding section 32 has a first edge 321 and a second edge 322. The second folding section 33 has a third edge 331 and a fourth edge 332. The first edge 321 of the first folding section 32 and the third edge 331 of the second folding section 33 are jointed to the first end 12 of the flexible circuit 1, while the second edge 322 of the first folding section 32 and the fourth edge 332 of the second folding section 33 are jointed to the first connector 31. Further, the second edge 322 of the first folding section 32 forms a folding line L1 with respect to the first connector 31 and the fourth edge 332 of the second folding section 33 forms a folding line L2 with respect to the first connector 31.

The second connection section 4 is set at a second end 13 of the flexible circuit 1. The second connection section 4 comprises a second connector 41, a third folding section 42, and a fourth folding section 43. The third folding section 42 has a first edge 421 and a second edge 422. The fourth folding section 43 has a third edge 431 and a fourth edge 432. The first edge 421 of the third folding section 42 and the third edge 431 of the fourth folding section 43 are jointed to the second end 13 of the flexible circuit 1, while the second edge 422 of the third folding section 42 and the fourth edge 432 of the fourth folding section 43 are jointed to the second connector 41. Further, the second edge 422 of the third folding section 42 forms a folding line L3 with respect to the second connector 41 and the fourth edge 332 of the fourth folding section 43 forms a folding line L4 with respect to the second connector 41.

Figure 2:
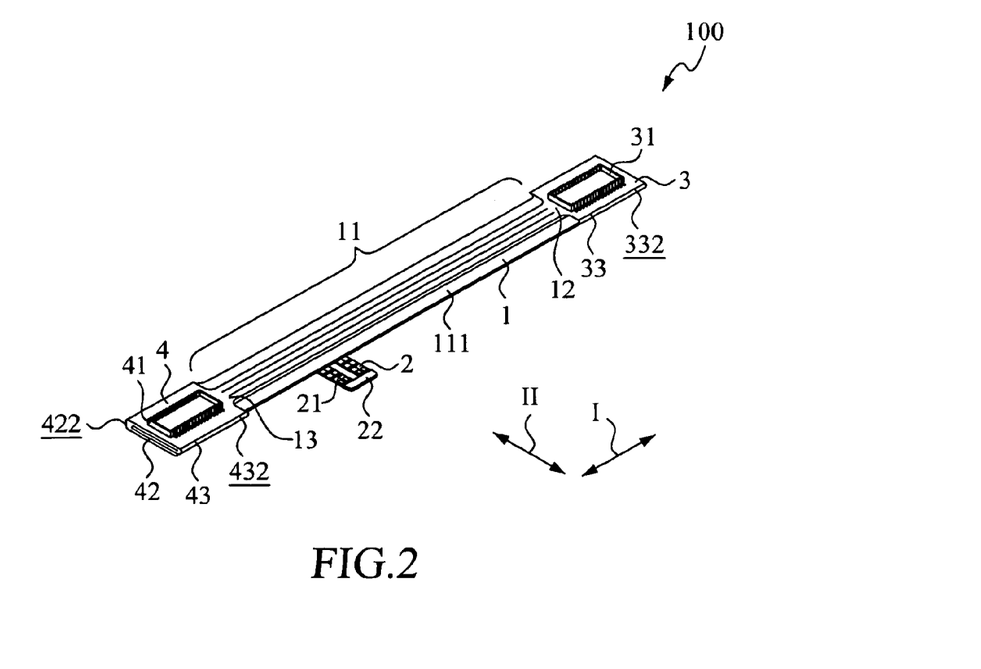
FIG. 2 is a perspective view showing an operation of folding the first embodiment of the present invention.
Figure 3:
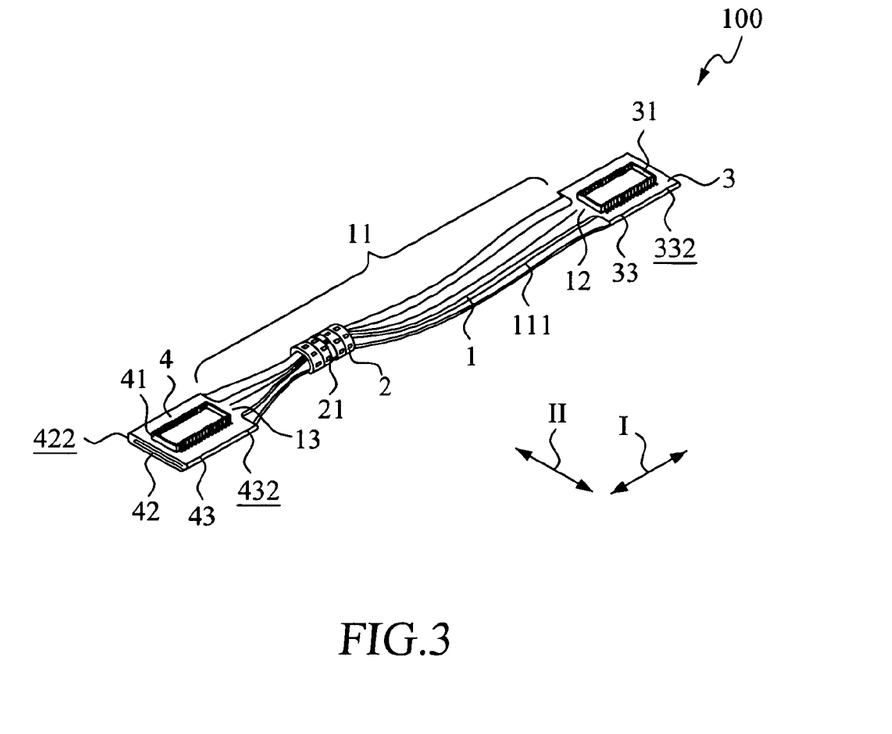
FIG. 3 is a perspective view showing a bundling structure of the first embodiment of the present invention bundling clustered flat cable components.

Also referring to FIGS. 2 and 3, FIG. 2 is a perspective view showing an operation of folding the first embodiment of the present invention and FIG. 3 is a perspective view showing the bundling structure of the first embodiment of the present invention bundling the clustered flat cable components. Through the folding lines L1, L2 of the first connection section 3 and the folding lines L3, L4 of the second connection section 4, the second folding section 33 and the fourth folding section 43, and the first folding section 32 and the third folding section 42, can be folded and lapping under the first connector 31 of the first connection section 3 and the second connector 41 of the second connection section 4 respectively, so as to make the clustered flat cable components of the cluster section 11 of the flexible circuit 1 stacked in the form of a bundle as shown in the drawings. Afterwards, the bundling structure 2 may be employed to bundle the clustered flat cable components of the cluster section 11 of the 1 together and the fastening section 22 of the bundling structure 2 fastens them together.

In the instant embodiment, the fastening section 22 of the bundling structure 2 comprises an adhesive layer, which adhesively secures a bundled structure of the stacked clustered flat cable components. Apparently, other means may be employed to achieve the same fastening and securing result, and it is noted that what is discussed here is an illustrative example only. Further, the hollow zone 21 of the bundling structure 2 provides the clustered flat cable components of the cluster section 11 of the flexible circuit 1 with sufficient clearance for flexing and bending when the clustered flat cable components are bundled together to form the bundled structure. This prevents stress concentration occurring at a bent site of the flat cable due to insufficient flexing clearance and excessive shifting induced by rotation, and thus protects the cable components from entangling with each other, twisting, and thus being damaged.

Figure 4:
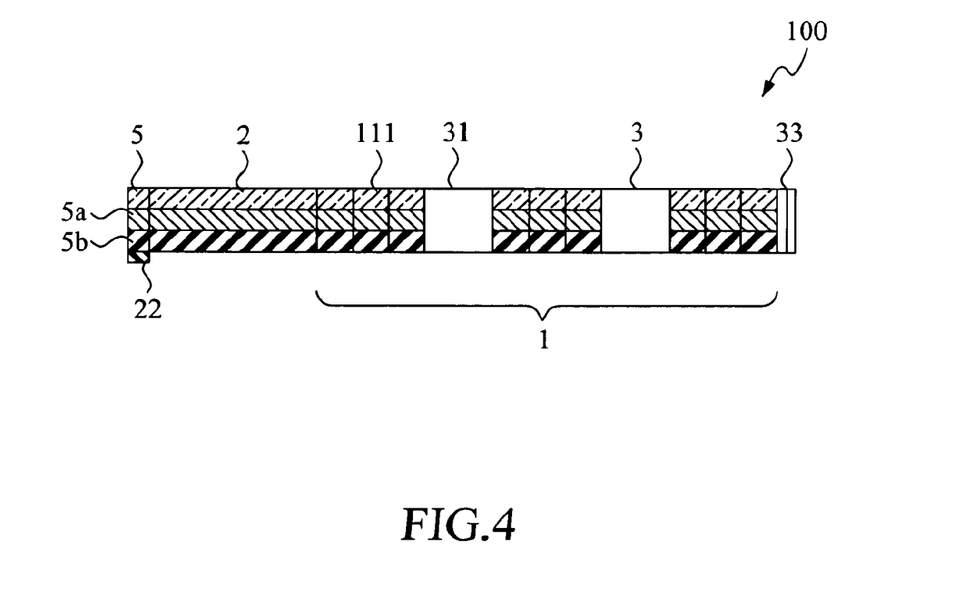
FIG. 4 is a cross-sectional view taken along line 4-4 of FIG. 1 that shows the first embodiment of the present invention.
Figure 5:
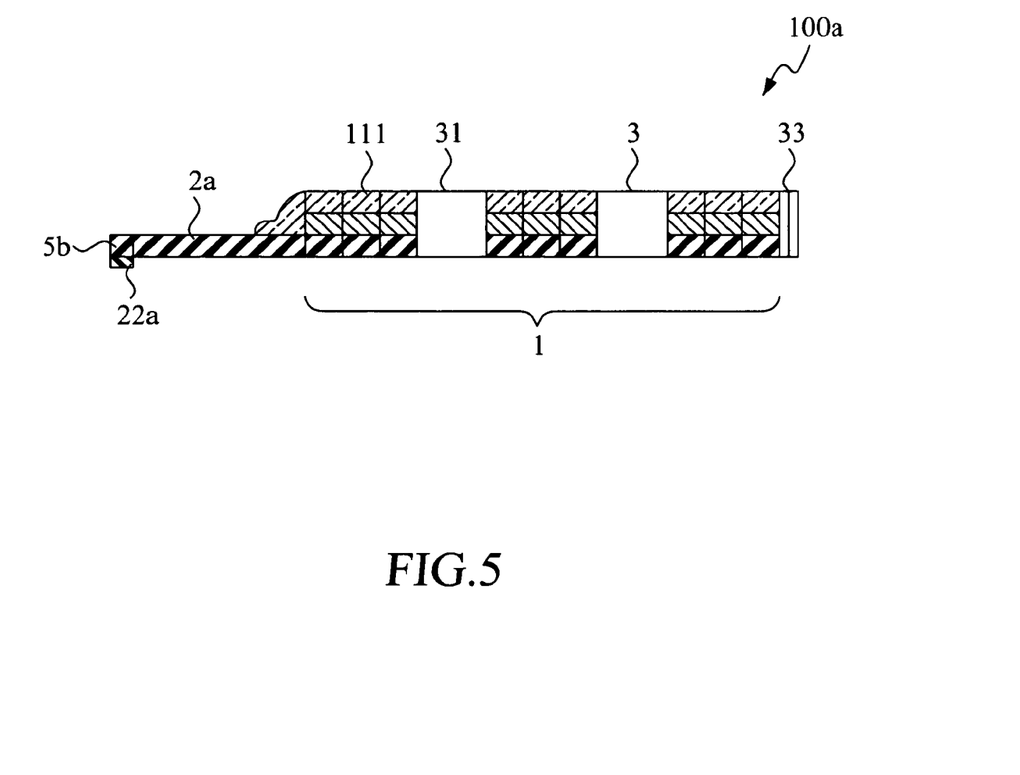
FIG. 5 is a cross-sectional view of a flat signal transmission cable with bundling structure in accordance with a second embodiment of the present invention.

Referring to FIGS. 4 and 5, FIG. 4 is a cross-sectional view taken along line 4-4 of FIG. 1 that shows the first embodiment of the present invention and FIG. 5 is a cross-sectional view of a flat signal transmission cable with bundling structure in accordance with a second embodiment of the present invention. The flat signal transmission cable 100 of the first embodiment and the flat signal transmission cable 100a of the second embodiment are substantially identical in respect of the constituent components and thus identical components of the two embodiments will carry the same reference numerals for corresponding to each other. The difference between the two embodiments resides in that the bundling structure 2 of the second embodiment is subjected to processing for removal of a cover lay 5 and copper layer 5a therefrom through an etching process so as to show the configuration illustrated in FIG. 5. It is apparent that the bundling structure 2 of the second embodiment may selectively preserve the cover lay 5 and the copper layer 5a on a substrate 5b so that the bundling structure 2 may maintain better rigidity.

Figure 6:
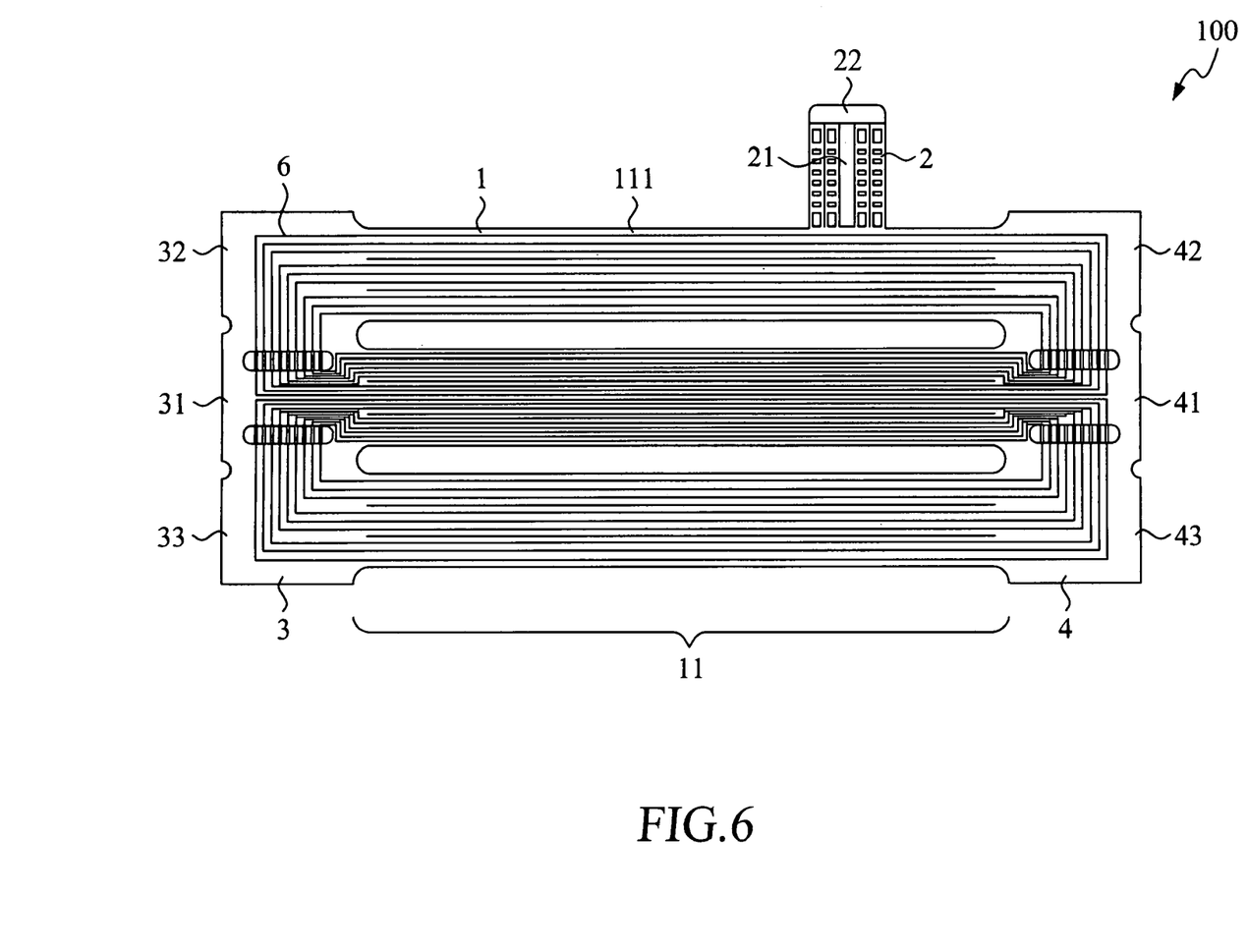
FIG. 6 is a bottom view of the first embodiment of the present invention.
Figure 7:
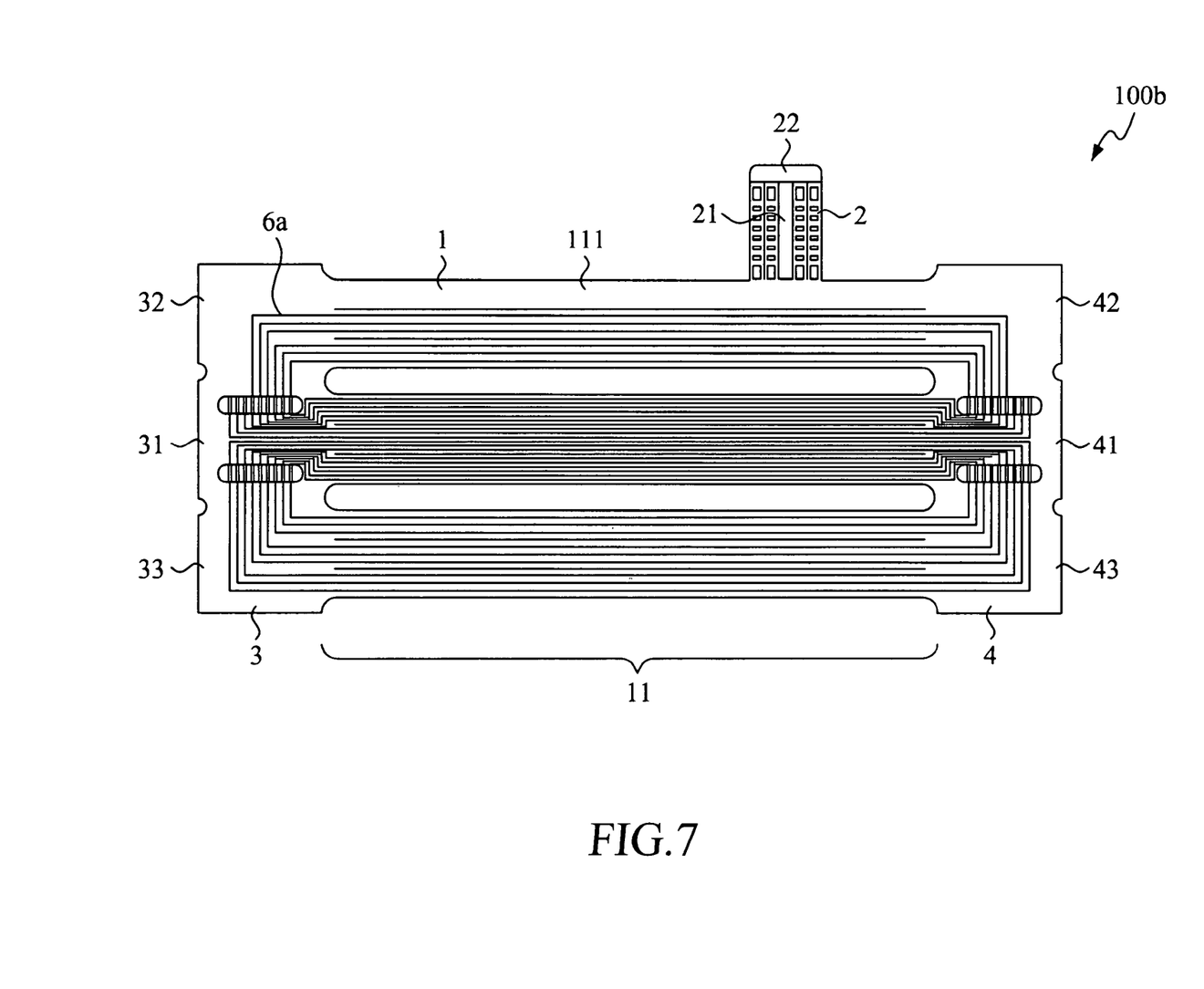
FIG. 7 is a bottom view showing a third embodiment in accordance with the present invention.

Referring to FIGS. 6 and 7, FIG. 6 is a bottom view of the first embodiment of the present invention and FIG. 7 is a bottom view showing a third embodiment in accordance with the present invention. A plurality of signal transmission lines 6 is arranged in and among the flexible circuit 1, the first connection section 3, and the second connection section 4. The flat signal transmission cable 100 of the first embodiment and the flat signal transmission cable 100b of the third embodiment are substantially identical in respect of the constituent components thereof and thus identical components of the two embodiments will carry the same reference numerals for corresponding to each other. The difference between the two embodiments resides in that the outermost clustered flat cable component 111 that carries the bundling structure 2 in the third embodiment does not contain any signal transmission line 6, but the remaining clustered flat cable components, excluding the outermost clustered flat cable component 111, of the cluster section 11 of the flexible circuit 1 all contain at least one signal transmission line 6, whereby when the outermost clustered flat cable component 111 that carries the bundling structure 2 breaks or wears out, the function of the flat signal transmission cable 100b will not be affected.

Figure 8:
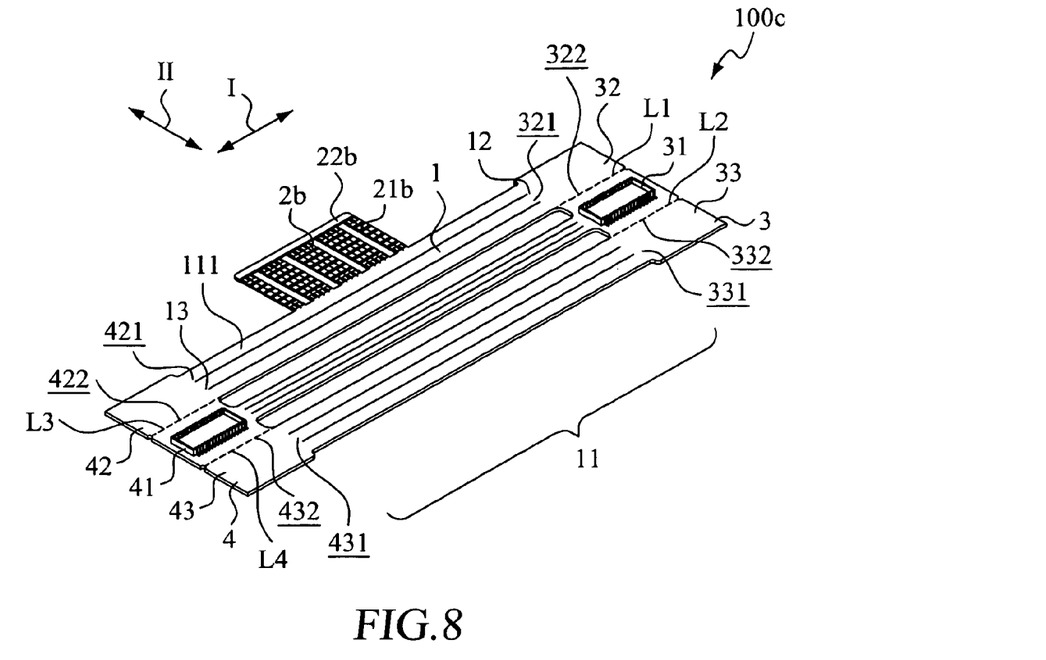
FIG. 8 is a perspective view showing a fourth embodiment of the present invention.
Figure 9:
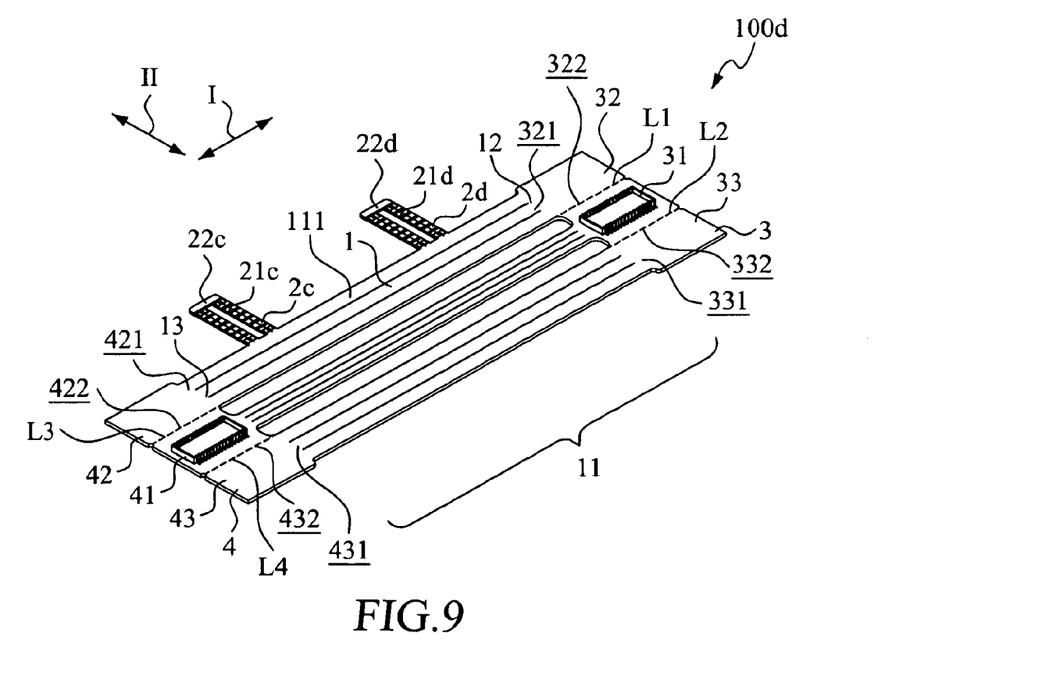
FIG. 9 is a perspective view showing a fifth embodiment of the present invention.

Referring to FIGS. 8 and 9, FIG. 8 is a perspective view showing a fourth embodiment of the present invention and FIG. 9 is a perspective view showing a fifth embodiment of the present invention. The flat signal transmission cable 100c in accordance with the fourth embodiment and the flat signal transmission cable 100d in accordance with the fifth embodiment are substantially identical to that of the first embodiment in respect of the constituent components thereof and thus identical components of the these embodiments will carry the same reference numerals for corresponding to each other. The difference of the fourth embodiment resides in that the bundling structure 2b of the fourth embodiment is elongated and shows the configuration illustrated in the drawing, including a plurality of hollow zones 21b and an elongated fastening section 22b. The difference of the fifth embodiment is that two bundling structures 2c, 2d are formed, respectively at predetermined angles, on a lateral side edge of the outermost clustered flat cable component 111 of the cluster section 11 of the flexible circuit 1 and respectively project outward in a direction II substantially perpendicular to the outermost clustered flat cable component 111.

Figure 10:
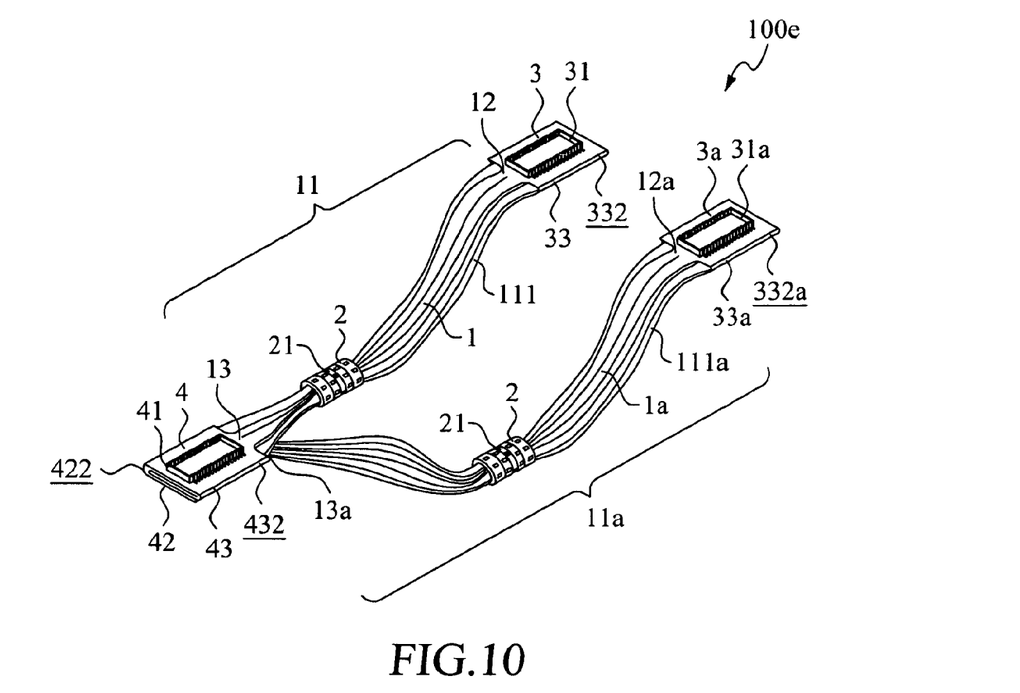
FIG. 10 is a perspective view showing a sixth embodiment of the present invention.

Referring to FIG. 10, which is a perspective view showing a sixth embodiment of the present invention, in the sixth embodiment, the flat signal transmission cable 100e is composed of constituent components that are substantially identical to those of the first embodiment and thus identical components of the two embodiments carry the same reference numerals for corresponding to each other. The difference resides in that the sixth embodiment comprises two flexible circuit 1, 1a, two bundling structures 2, two first connection sections 3, and a second connection section 4, forming a configuration as shown in the drawing. The arrangement of the components is substantially identical to that of the first embodiment and no further discussion is needed.

Figure 11:
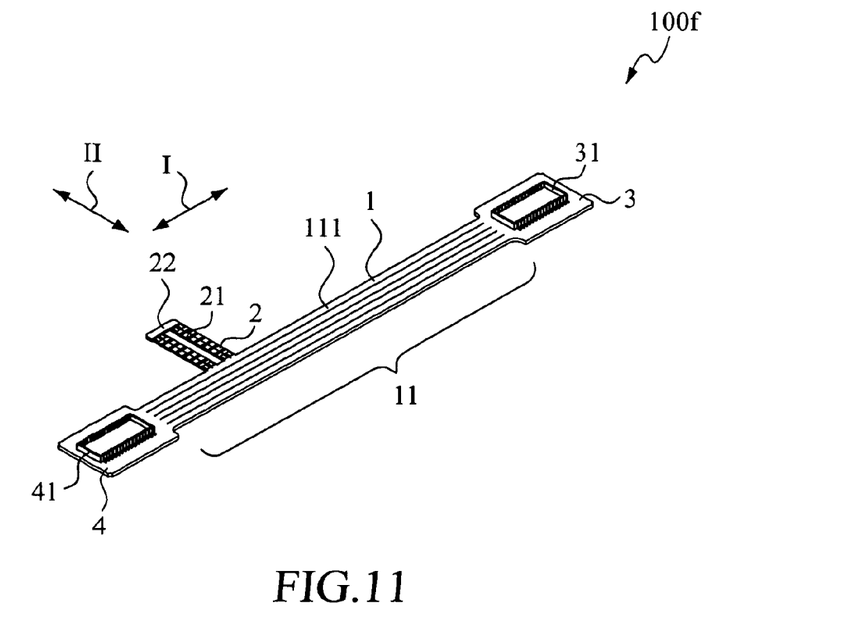
FIG. 11 is a perspective view showing a seventh embodiment of the present invention.

Referring to FIG. 11, which is a perspective view showing a seventh embodiment of the present invention, in the seventh embodiment, the flat signal transmission cable 100f is composed of constituent components that are substantially identical to those of the first embodiment and thus identical components of the two embodiments carry the same reference numerals for corresponding to each other. The difference resides in that the seventh embodiment comprises a flexible circuit 1, a bundling structure 2, a first connection section 3, and a second connection section 4, but the first connection section 3 and the second connection section 4 form no folding sections that are included in the first embodiment, meaning folding and lapping the folding sections to form a bundled structure of the stacked clustered flat cable components of the cluster section 11 of the flexible circuit 1 is not needed in the seventh embodiment and the clustered flat cable components of the cluster section 11 of the flexible circuit 1 in the seventh embodiment can be directly bundled by the bundling structure 2 and secured by fastening the fastening section 22 to form the configuration illustrated in the drawing.

It is apparent that the above description of the embodiments of the present invention is provided for illustration of some of a variety of example embodiments available and it is noted that those embodiments that shows the essential feature of the present invention of a flat signal transmission cable having a bundling structure and modifications of those embodiments showing equivalents in structure and function are both considered within the scope of the present invention.

Figure 12:
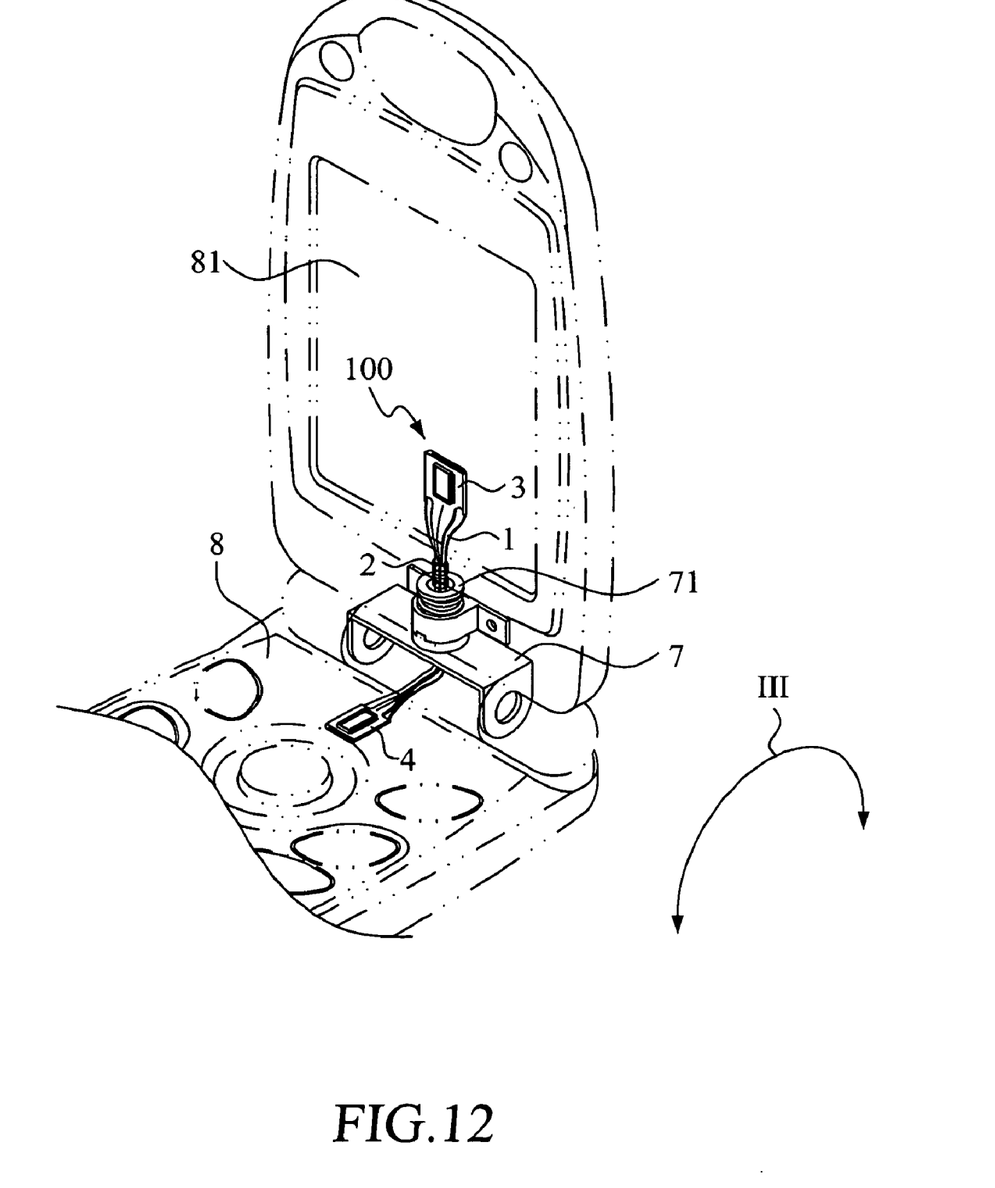
FIG. 12 is a schematic view showing an application of the present invention in a one-axis rotational axle.
Figure 13:
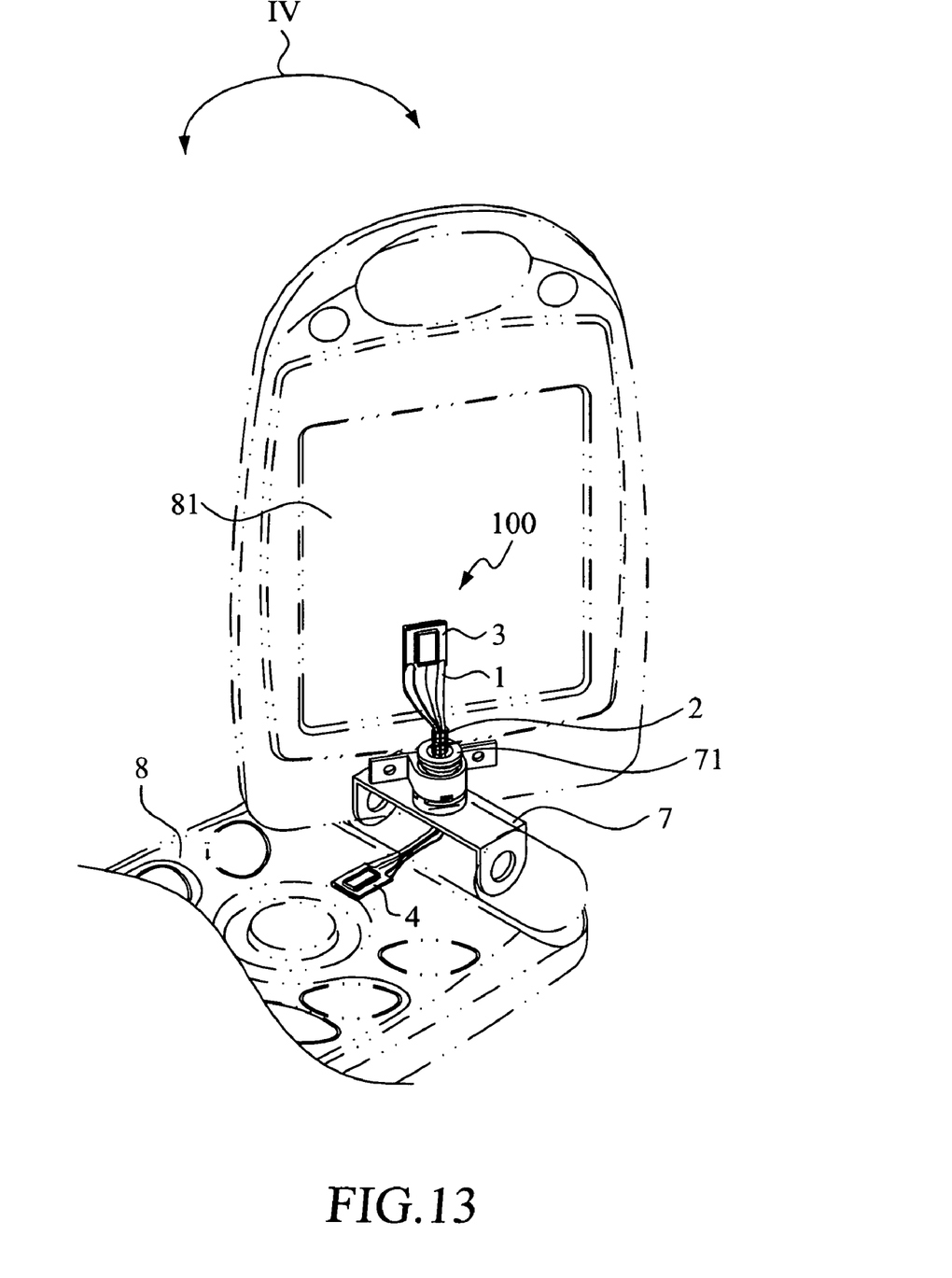
FIG. 13 is a schematic view showing an application of the present invention in a two-axis rotational axle.

Reference is now made to both FIGS. 12 and 13. FIG. 12 is a schematic view showing an application of the present invention in a one-dimensional rotational axle and FIG. 13 is a schematic view showing an application of the present invention in a two-dimensional rotational axle. In the application of the flat signal transmission cable 100 of the present invention to an electronic device 8 comprising a one-axis or two-axis rotational axle 7, wherein in the electronic device 8 is for example a mobile phone, the first connection section 3 and the second connection section 4 of the flat signal transmission cable 100 of the present invention can easily pass through a bore 71 of the rotational axle 7 and the flat signal transmission cable 100 is not affected by the rotation of the rotational axle 7. When a screen 81 is rotated in a frontward-rearward turning direction III on the electronic device 8, or is rotated in a horizontal rotation direction IV, the flat signal transmission cable 100 of the present invention will not be affected by frontward-rearward turning or horizontal rotation to cause abrasion of the rotational axle 7 with respect to the clustered flat cable component 111 and the rotational axle 7 only abrades and compresses the bundling structure 2, whereby the clustered flat cable component 111 receives the best protection from the bundling structure 2 and is still allowed for free rotation within the bundling structure 2 to release any stress induced.

Although the present invention has been described with reference to the preferred embodiments thereof, it is apparent to those skilled in the art that a variety of modifications and changes may be made without departing from the scope of the present invention which is intended to be defined by the appended claims.

What is claimed is:

1. A flat signal transmission cable comprising:
at least one flexible circuit having a cluster section that includes a cluster structure composed of a plurality of clustered flat cable components that is formed by slitting in a direction parallel to extension direction of the flexible circuit to impose free and independent flexibility for bending each clustered flat cable component; and
at least one bundling structure formed on a lateral side edge of a predetermined clustered flat cable component extending transversely therefrom, the bundling structure including a fastening section;
whereby when the clustered flat cable components are stacked to form a bundled structure, the bundling structure bundles the plurality of clustered flat cable components and secured by the fastening section.

2. The flat signal transmission cable as claimed in claim 1, wherein the predetermined clustered flat cable component that forms the bundling structure comprises at least one signal transmission line and remaining clustered flat cable components of the cluster section of the flexible circuit all comprise at least one signal transmission line.

3. The flat signal transmission cable as claimed in claim 1, wherein the predetermined clustered flat cable component that forms the bundling structure comprises no signal transmission line and remaining clustered flat cable components of the cluster section of the flexible circuit all comprise at least one signal transmission line.

4. The flat signal transmission cable as claimed in claim 1, wherein the bundling structure forms at least one hollow zone.

5. The flat signal transmission cable as claimed in claim 1, wherein the fastening section of the bundling structure comprises an adhesive layer, which adhesively secures the bundled structure of the stacked clustered flat cable components when the bundling structure bundles the plurality of the clustered flat cable components.

6. The flat signal transmission cable as claimed in claim 1, wherein the bundling structure is formed at a predetermined angle on one side of a predetermined clustered flat cable component that is formed by slitting in an extension direction of the flexible circuit.

7. The flat signal transmission cable as claimed in claim 1, wherein the flexible circuit comprises a first end at which a first connection section is set, a first connector being mounted on the first connection section.

8. The flat signal transmission cable as claimed in claim 7, wherein the first connection section of the flexible circuit comprises at least one folding section that has a first edge and a second edge, the first edge being jointed to the first end of the flexible circuit, the second edge being jointed to the first connector, the second edge forming a folding line with respect to the first connector.

9. The flat signal transmission cable as claimed in claim 1, wherein the flexible circuit comprises a second end at which a second connection section is set, a second connector being mounted on the second connection section.

10. The flat signal transmission cable as claimed in claim 9, wherein the second connection section of the flexible circuit comprises at least one folding section that has a first edge and a second edge, the first edge being jointed to the second end of the flexible circuit, the second edge being jointed to the second connector, the second edge forming a folding line with respect to the second connector.

11. The flat signal transmission cable as claimed in claim 1, wherein the flexible circuit and the bundling structure are formed of a substrate and a copper layer and a cover lay provided on the substrate.

12. The flat signal transmission cable as claimed in claim 11, wherein the cover lay and the copper layer are removed from the substrate of the bundling structure through an etching process.

* * * * *